(12) United States Patent
Kato

(10) Patent No.: US 11,515,673 B2
(45) Date of Patent: Nov. 29, 2022

(54) ELECTRICAL CONNECTOR MODULE WITH SHIELDING MEMBERS ENGAGING UPON CONNECTION TO A MATING CONNECTOR

(71) Applicant: HOSIDEN CORPORATION, Osaka (JP)

(72) Inventor: Ryuhei Kato, Osaka (JP)

(73) Assignee: Hosiden Corporation, Osaka (JP)

( * ) Notice: Subject to any disclaimer, the term of this patent is extended or adjusted under 35 U.S.C. 154(b) by 0 days.

(21) Appl. No.: 17/216,938

(22) Filed: Mar. 30, 2021

(65) Prior Publication Data

US 2021/0313746 A1    Oct. 7, 2021

(30) Foreign Application Priority Data

Apr. 7, 2020    (JP) .............................. JP2020-069272

(51) Int. Cl.
  *H01R 13/6581*    (2011.01)
  *H01R 13/432*    (2006.01)
  (Continued)

(52) U.S. Cl.
  CPC ....... *H01R 13/6581* (2013.01); *H01R 13/432* (2013.01); *H01R 13/512* (2013.01);
  (Continued)

(58) Field of Classification Search
  CPC ............ H01R 13/6581; H01R 13/432; H01R 13/512; H01R 13/521; H01R 13/6215;
  (Continued)

(56) References Cited

U.S. PATENT DOCUMENTS 10,601,191 B2    3/2020  Yamazaki
2018/0006407 A1    1/2018  Sasaki
(Continued)

FOREIGN PATENT DOCUMENTS

EP    3 264 537 A1    1/2018
EP    3 343 705 A1    7/2018
(Continued)

OTHER PUBLICATIONS

European Search Report from Application No. 21165791.1 dated Sep. 1, 2021.
U.S. Appl. No. 17/332,308, filed May 27, 2021.

*Primary Examiner* — Abdullah A Riyami
*Assistant Examiner* — Justin M Kratt
(74) *Attorney, Agent, or Firm* — Dilworth & Barrese, LLP

(57) ABSTRACT

Provided is a connector module that is highly durable and that also allows easy position alignment with a connection target instrument while maintaining high shielding performance. The connector module includes a connector case and a connector inserted in the connector case. The connector includes a contact, a holder, a conductive tubular shell, a housing and a conductive shield case. The shield case includes a first member having an elastic portion and a second member in the form of a bottomed tube. The first member forms an elastic piece contactable with the second member. Fixing of the connector case to a main body case via a fastener member causes, in the connector, elastic deformation of the elastic piece, resulting in decrease in a gap between the first member and the second member, consequently in establishment of electrical connection between the first member and the second member.

2 Claims, 8 Drawing Sheets

(51) Int. Cl.
- *H01R 13/512* (2006.01)
- *H01R 13/52* (2006.01)
- *H01R 13/6596* (2011.01)
- *H01R 24/40* (2011.01)
- *H01R 13/6583* (2011.01)
- *H04N 5/225* (2006.01)
- *H05K 9/00* (2006.01)
- *H01R 24/54* (2011.01)
- *H01R 13/621* (2006.01)
- *H01R 13/639* (2006.01)
- *H01R 13/6582* (2011.01)
- *H01R 13/6597* (2011.01)
- *H01R 12/91* (2011.01)
- *H01R 13/74* (2006.01)
- *H01R 13/631* (2006.01)
- *H01R 103/00* (2006.01)

(52) U.S. Cl.
CPC ....... *H01R 13/521* (2013.01); *H01R 13/6215* (2013.01); *H01R 13/639* (2013.01); *H01R 13/6583* (2013.01); *H01R 13/6596* (2013.01); *H01R 24/40* (2013.01); *H01R 24/542* (2013.01); *H04N 5/2251* (2013.01); *H04N 5/2257* (2013.01); *H05K 9/0018* (2013.01); *H01R 12/91* (2013.01); *H01R 13/5202* (2013.01); *H01R 13/6315* (2013.01); *H01R 13/6582* (2013.01); *H01R 13/6597* (2013.01); *H01R 13/748* (2013.01); *H01R 2103/00* (2013.01); *H01R 2201/26* (2013.01)

(58) Field of Classification Search
CPC .............. H01R 13/639; H01R 13/6583; H01R 13/6596; H01R 24/40; H01R 24/542; H01R 12/91; H01R 13/5202; H01R 13/6315; H01R 13/6582; H01R 13/6597; H01R 13/748; H01R 2103/00; H01R 2201/26; H04N 5/2251; H04N 5/2257; H05K 9/0018

See application file for complete search history.

(56) References Cited

U.S. PATENT DOCUMENTS

| | | | |
|---|---|---|---|
| 2018/0183169 A1* | 6/2018 | Yamanaka | H01R 13/4367 |
| 2018/0287306 A1 | 10/2018 | Grimes et al. | |

FOREIGN PATENT DOCUMENTS

| | | | | |
|---|---|---|---|---|
| JP | 2007-127206 | A | 5/2007 | |
| JP | 2014-137913 | A | 7/2014 | |
| JP | 2019-67740 | A | 4/2019 | |
| WO | 2017/125164 | A1 | 7/2017 | |
| WO | WO-2017125164 | A1 * | 7/2017 | ......... H01R 13/6582 |

* cited by examiner

ELECTRICAL CONNECTOR MODULE WITH SHIELDING MEMBERS ENGAGING UPON CONNECTION TO A MATING CONNECTOR

CROSS REFERENCE TO RELATED APPLICATION

This application is based on and claims priority under 35 U.S.C. Section 119 to Japanese Patent Application No. 2020-69272 filed on Apr. 7, 2020, the entire content of which are incorporated herein by reference.

TECHNICAL FIELD

This disclosure relates to a connector module to be electrically connected to a connection target instrument.

BACKGROUND ART

Conventionally, there is known a connector module to be electrically connected to a connection target instrument such as a camera module (see e.g. Japanese Unexamined Patent Application No. 2019-67740 publication). The connector module disclosed in Japanese Unexamined Patent Application No. 2019-67740 publication includes a connector case fixed to a main body case of the connection target instrument and a connector accommodated in the connector case ("terminal module" in the document). The connector includes a contact ("center conductor" in the document), an insulator holder supporting the contact inserted therein ("insulator holder" in the document), a conductive tubular shell ("conductive shell" in the document) surrounding the outer circumferential portion of the holder, and a conductive shield case placed in engagement with the tubular shell for shielding against external electromagnetic waves. The shield case includes, as projections, a plurality of elastic portions engageable with the outer circumferential portion of the tubular shell. These elastic portions function to maintain good contact between the tubular shell and the shield case, thus realizing high shielding performance.

Japanese Unexamined Patent Application No. 2007-127206 discloses a connector module to be electrically connected to a connection target instrument having a circuit board. The connector module disclosed in Japanese Unexamined Patent Application No. 2007-127206 includes a seal device to be fixed to a case of the connection target instrument and a connector fixed to the seal device. The seal device includes an outer circumferential annular member adhesively secured to the case, an inner annular member adhesively secured to the outer circumference of the connector, and a flexible thin film member fixedly attached to the outer circumferential annular member and the inner annular member. It is described that as the flexible thin film member fills the gap present between the connector and the case, positional displacement (misalignment) if any present between the case and the connector can be absorbed.

Japanese Unexamined Patent Application No. 2014-137913 discloses a connector module ("floating connector" in the document) to be electrically connected with a connection target instrument having a coaxial plug. The connector module disclosed in Japanese Unexamined Patent Application No. 2014-137913 includes a tubular outer shell to be fixed to a case and a tubular movable shell to be movably assembled with the tubular outer shell via a seal member. It is described that as the tubular movable shell is movable relative to the tubular outer shell, fitting connection is still possible even if a positional displacement is present in the insertion position of the coaxial plug.

SUMMARY

The connector module disclosed in Japanese Unexamined Patent Application No. 2019-67740 publication includes a conductive shield case engageable with a tubular shell for providing shield against external electromagnetic waves, so it is possible to secure high shielding performance. Yet, this module has room for improvement in the respect of absorption of positional displacement between the connection target instrument and the connector. On the other hand, the connector module disclosed in Japanese Unexamined Patent Application No. 2007-127206 is capable of absorbing positional displacement between the connection target instrument and the connector, thanks to the flexible thin film member, yet this flexible thin film member is problematic in its strength. The connector module disclosed in Japanese Unexamined Patent Application No. 2014-137913 is capable of absorbing positional displacement between the connection target instrument and the connector as the tubular movable shell is movable relative to the tubular outer shell. Yet, there is a risk of the tubular movable shell coming into repeated contacts with the tubular outer shell due to e.g. vibration, which causes a problem relating to durability. Moreover, this connector module disclosed in Japanese Unexamined Patent Application No. 2014-137913 is not able to maintain a fixed distance between the tubular movable shell and the tubular outer shell, thus it is difficult to achieve an impedance matching, thus presenting possibility of giving adverse influence to high frequency propagation performance.

In view of the above, there is a need for a connector module that is highly durable and that also allows easy position alignment with a connection target instrument while maintaining high shielding performance.

In one aspect of a connector module proposed taking the above into consideration, a connector module configured to be electrically connected to a connection target instrument, comprises:

a connector case to be fixed to a main body case of the connection target instrument via a fastener member;

a connector inserted in the connector case;

the connector including a conductive contact, an insulator holder supporting the contact inserted therein, a conductive tubular shell surrounding the outer side of the holder, an insulator housing supporting the tubular shell inserted therein, and a conductive shield case engageable with the tubular shell for shielding against external electromagnetic waves;

the shield case including a first member having an elastic portion to come into contact with an outer circumferential portion of the tubular shell protruding from the housing and a second member in the form of a bottomed tube coming into contact with the first member;

the first member forming an elastic piece contactable with the second member; and fixing of the connector case to the main body case via the fastener member causing, in the connector, elastic deformation of the elastic piece, resulting in decrease in a gap between the first member and the second member, consequently in establishment of electrical connection between the first member and the second member.

In the above-described configuration, the shield case is engaged with the tubular shell via the elastic portion. Thus, even if vibration or the like occurs, the elastic portion will be deformed flexibly to absorb the resultant shock. As a result, the durability of the tubular shell and/or the shield case can be improved.

Further, in the above configuration, the shield case includes the first member and the second member and in the first member, there is formed an elastic piece contactable with the second member. When the connector case is fixed to the main body case via the fastener member, in the connector, resultant elastic deformation occurring in the elastic member serves to reduce the gap between the first member and the second member, thus establishing electrical connection between the first member and the second member. Namely, in the connector before being fixed to the main body case of the connection target instrument via the fastener member, a gap is present between the first member and the second member due to the presence of the elastic piece formed in the first member. As a result, progressive flexible deformation of the elastic member allows relative movement of the first member relative to the second member. Therefore, even if positional displacement is present between the axes of these members at the time of attachment of the connection target instrument to the connector, the first member engaged via its elastic portion with the tubular shell enclosing the contact will move together with the tubular shell, in the course of which the positional displacement will be resolved and positional alignment can be established consequently.

Moreover, when the connector case is fixed to the main body case via the fastener member, in the connector, the elastic piece is elastically deformed to reduce the gap between the first member and the second member, thus establishing electric connection therebetween. In this way, the connector module having the above configuration can maintain high shielding performance.

As described above, it has now become possible to provide a connector module that is highly durable and that also allows easy position alignment with a connection target instrument while maintaining high shielding performance.

Preferably, the elastic piece extends from an outer edge portion of the first member.

The above arrangement of the elastic piece extending from an outer edge portion of the first member provides an advantage of facilitating the elastic deformation, thus rendering the contact state between the first member and the second member favorable. Moreover, since the arrangement requires merely providing the elastic piece as an extension member from the outer edge portion of the first member, working of the first member is made easy.

Preferably, the elastic piece is formed by cutting out a part of the first member.

With the above arrangement of forming the elastic piece by cutting out a part of the first member, the elastic deformation is made easy, so that the contact state between the first member and the second member is rendered favorable. Moreover, by providing the cut-out part within a minimum area, it becomes also possible to secure a larger area for the first member and a larger area also for the contact between the first member and the second member. Further, as the elastic piece is formed within the first member, it becomes possible to improve the yield of material to form the first member.

Further preferably, the housing includes an outer circumferential portion that protrudes to the outer side and that is fixed to the outer face of the connector case.

With the above-described arrangement in which in the housing, there is formed an outer circumferential portion to be fixed to the outer face of the connector case, it becomes readily possible to fix this outer circumferential portion to the connector case by means of e.g. welding. Further, as the connector case to be fixed and fastened to the connection target instrument is fixed to the housing, even if a load is applied to the connector due to vibration, etc., this load can be effectively received by the connector case and the housing. As a result, it is possible to suppress a load which may be applied between the conductive members of the connector (the contact, the tubular shell, the shield case) and a conductive member of the connection target instrument (e.g. an electronic component on the circuit board).

Further preferably, between the connector case and the shield case, there is provided a rotation-preventing member engageable with the housing for preventing rotation of the housing.

With the above arrangement of providing a rotation-preventing member for preventing rotation of the housing, positioning of the housing can be carried out in a reliable manner, so that a fixing operation of fixing the housing to the connector case is facilitated.

Further preferably, the housing includes an outer circumferential portion that protrudes to the outer side and that is fixed to the inner face of the connector case, and there is provided a seal member capable of forming a gap between the connector case and the outer circumferential portion.

With the above-described arrangement, while the seal member ensures sealing performance, the connector before the connector case is fixed to the main body case of the connection target instrument via the fastener member can be readily fixed in position with the connection target instrument, thanks to the gap formed by the seal member.

DESCRIPTION OF EMBODIMENTS

Next, embodiments of a connector module relating to the present disclosure will be explained with reference to the accompanying drawings.

Figure 1:
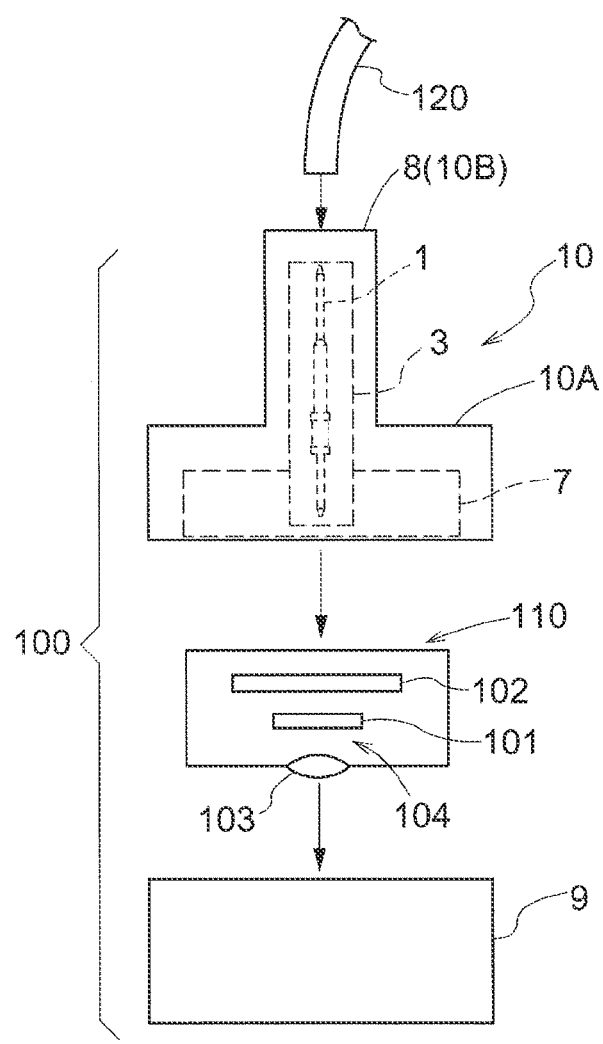
FIG. 1 is a view schematically showing an arrangement of a camera unit (vehicle-mounted camera)

In this embodiment, as schematically shown in FIG. 1, there will be explained, as an example thereof, a connector module 10 to be used in a camera unit 100 (vehicle-mounted camera) configured to be mounted in a vehicle. It is understood, however, that the invention is not limited to the following embodiments, but various modifications will be possible within a range not deviating from the essence thereof.

As shown in FIG. 1, the camera unit 100 includes a camera module 110 (an example of "connection target instrument"), the connector module 10 and an insulator main body case 9 formed of a resin or the like for accommodating the camera module 110 therein. The camera module 110 includes, at least, an image sensor 101, an electronic circuit 102 for controlling driving of the image sensor 101 and processing image signals outputted from the image sensor 101, and an optical system 104 having a lens 103 for condensing light onto the image sensor 101. This camera unit 100 can be used also for other applications than vehicle mounting application (e.g. can be mounted on a bicycle, a drone, etc.)

The camera unit 100 is electrically connected to an image processing device (not shown) or a monitor device (not shown) via a coaxial cable 120. The coaxial cable 120 is a cable configured such that an inner conductor and an outer conductor are arranged coaxially across a dielectric (insulator) therebetween. The inner conductor is responsible for signal transmission and the outer conductor functions as a shield for suppressing influence of electromagnetic waves to the inner conductor. In this embodiment, the inner conductor is responsible also for supplying power from the image processing device or the monitor device to the image sensor 101 and the electronic circuit 102 of the camera unit 100 and also for outputting video signals outputted from the image sensor 101 and the electronic circuit 102 to the image processing device and the monitor device.

The image sensor 101 of the camera module 110 is a CCD (Charge Coupled Device) sensor or a CIS (CMOS Image Sensor). The lens 103 is not limited to a single sheet of lens, but may be plurality of sheets of lens. The electronic circuit 102 includes a clock driver for driving the image sensor 101, an A/D converter for converting analog signals outputted from the image sensor 101 to digital signals, and so on.

The electronic circuit 102 is configured as a circuit board including electronic devices or components mounted on a signal or a plurality of printed boards. In this, a flexible board may be used for electrical connection between adjacent circuit boards. On the circuit board on which the electronic circuit 102 is formed, a receptacle A (see FIG. 5) is mounted. The connector module 10 is electrically connected not only to the receptacle A, but also electrically connected to the coaxial cable 120 to establish electrical connection between the electronic circuit 102 and the coaxial cable 120.

First Embodiment

Figure 2:
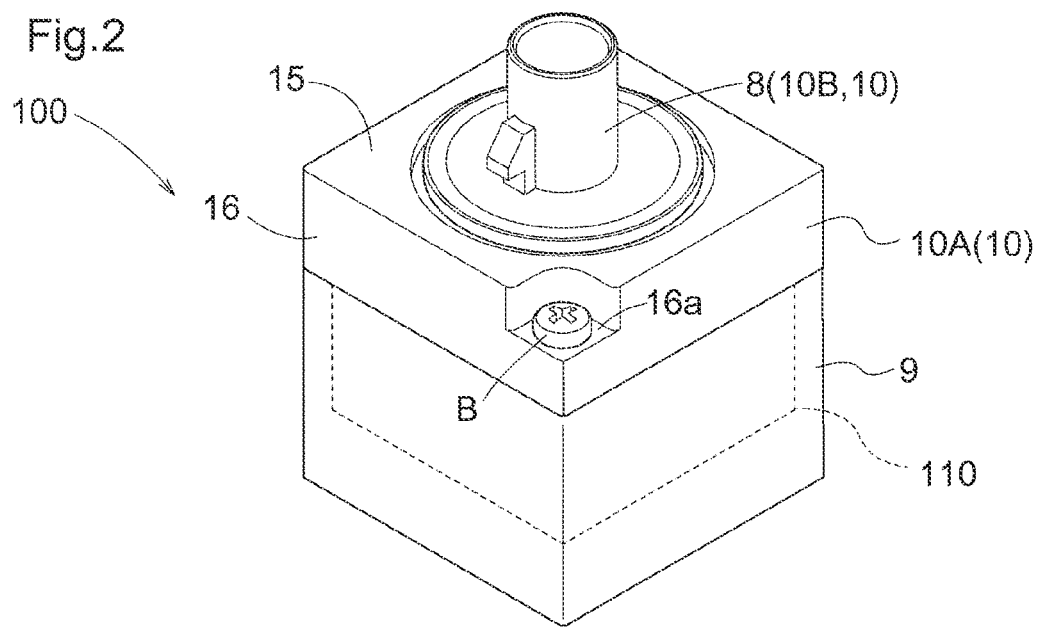
FIG. 2 is an overall perspective view of the camera unit.
Figure 3:
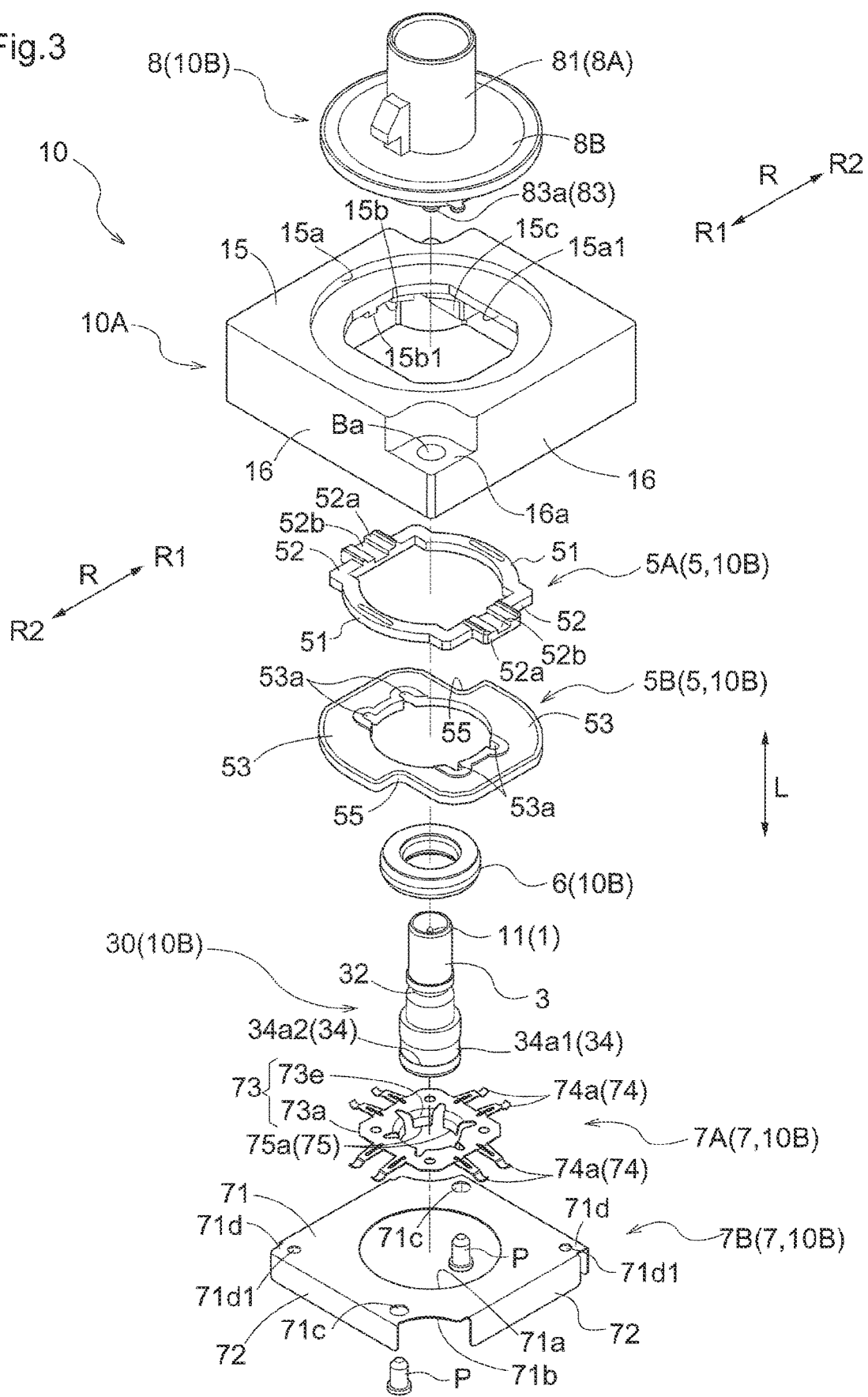
FIG. 3 is an exploded perspective view of a connector module according to a first embodiment.
Figure 4:
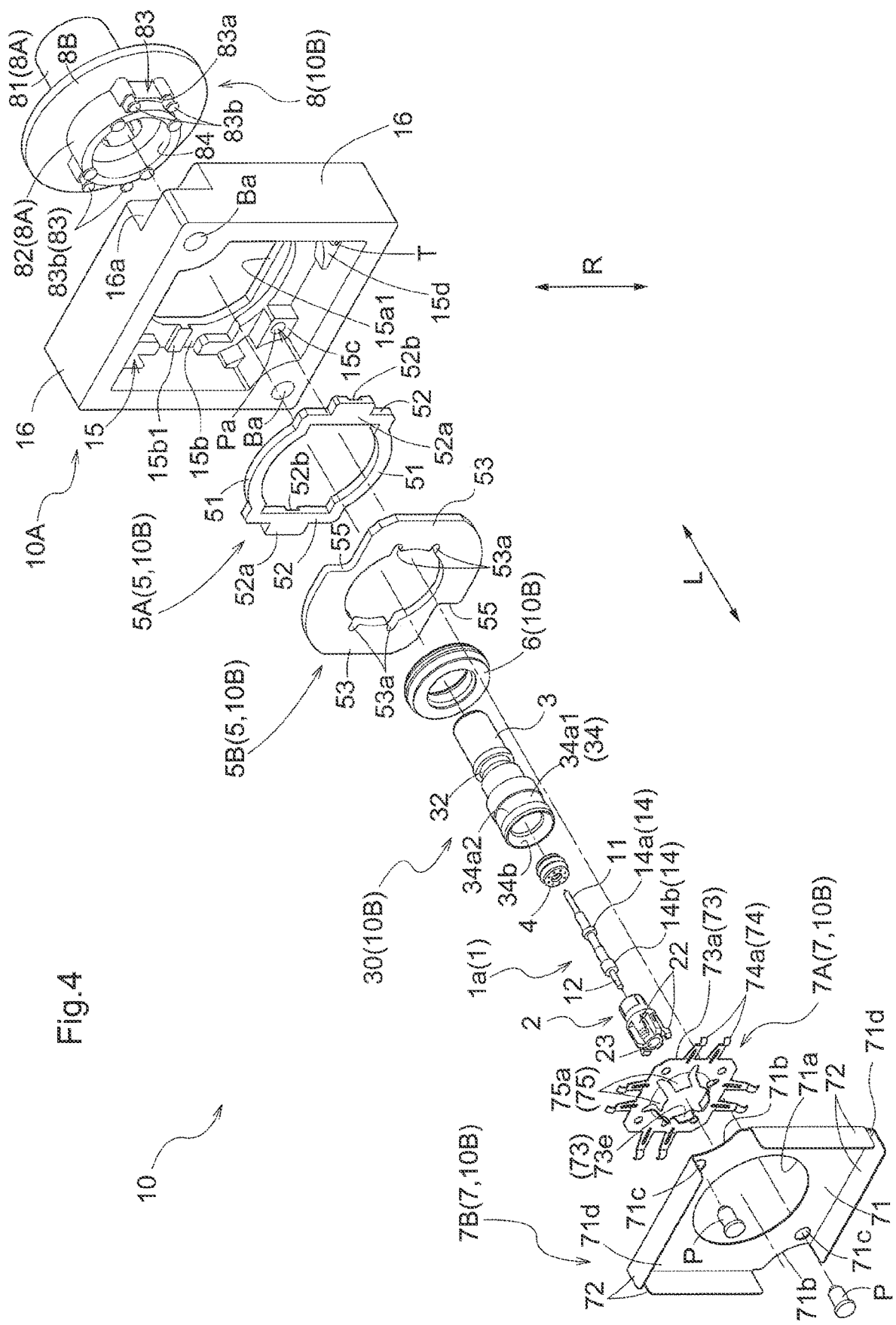
FIG. 4 is an exploded perspective view of the connector module according to the first embodiment.
Figure 5:
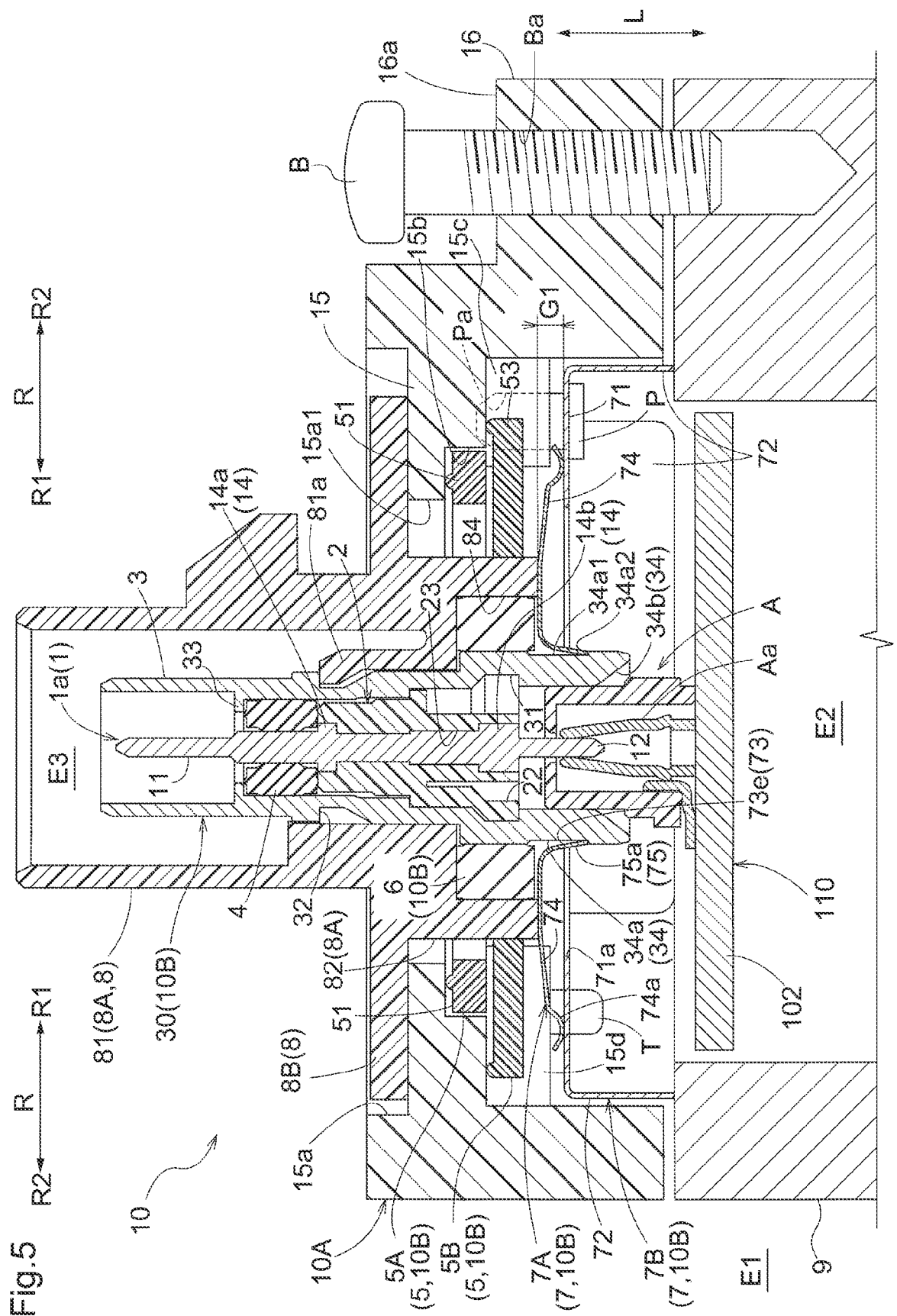
FIG. 5 is a vertical section of the connector module according to the first embodiment.

FIG. 2 shows an overall perspective view of the camera unit 100. FIGS. 3-4 show exploded perspective views of the connector module 10. FIG. 5 shows a vertical section of the connector module 10. As shown in FIG. 2, the connector module 10 includes a connector case 10A and a connector 10B inserted in the connector case 10A. The connector case 10A and the main body case 9 are fixed to each other via a plurality of (two in this embodiment) bolts B (an example of "fastener member"). As shown in FIG. 3, the connector 10B includes a housing 8, a terminal module 30, an outer seal member 6, a shield case 7 and a rotation-preventing mechanism 5 (an example of "rotation-preventing member"). Further, as shown in FIG. 4, the terminal module 30 includes a center conductor 1 (or a core conductor; an example of "conductor"), a holder 2, a tubular shell 3 and an inner seal member 4. The terminal module 30 has similar functions to those of the coaxial cable 120 described above. The center conductor 1 corresponds to the inner conductor of the coaxial cable 120, the holder 2 corresponds to the dielectric (insulator) of the coaxial cable 120 and the tubular shell 3 corresponds to the outer conductor of the coaxial cable 120.

As shown in FIG. 5, the connector case 10A is a case for accommodating the connector 10B, whereas the housing 8 of the connector 10B is s case for accommodating the terminal module 30 and the outer seal member 6. As shown in FIG. 2, the connector case 10A, in the camera unit 100, is to be located rearwardly of the camera module 110. For this reason, it may sometimes be called a "rear case". In alike manner, the main body case 9 may sometimes be called a "front case" relative to the rear case in the camera unit 100. The connector case 10A in which the housing 8 is inserted and fixed and the main body case 9 are fastened to each other via the plurality of bolts B, forming therein an accommodating space for the terminal module 30, the outer seal member 6, the shield case 7, the rotation-preventing mechanism 5 and the receptacle A (see also FIG. 5).

As shown in FIG. 5, the shield case 7 shields an inner space E2 of the shield case 7 against electromagnetic waves propagated through an outer space E1 of the shield case 7. More particularly, the shield case 7 covers at least a part of the receptacle A of the camera module 110, thus shielding the electronic circuit 102 against the electromagnetic waves such as electromagnetic noise. This shield case 7 is connected to the ground (GND) of the electronic circuit 102. The outer conductor of the coaxial cable 120 described above is electrically connected to the tubular shell 3. As will be described later herein, the shield case 7 and the tubular shell 3 are electrically connected to each other. Therefore, when the shield case 7 is connected to the ground of the electronic circuit 102, the tubular shell 3 and the outer conductor of the coaxial cable 120 are also connected to the ground of the electronic circuit 102.

Next, with reference to FIGS. 2-6, the connector module 10 relating to the first embodiment will be described in greater details.

As described above, the connector module 10 includes the connector case 10A and the connector 10B. The connector 10B includes the housing 8, the terminal module 30, the outer seal member 6, the shield case 7 and the rotation-preventing mechanism 5. Further, the terminal module 30 includes the center conductor 1, the holder 2, the tubular shell 3 and the inner seal member 4.

As shown in FIGS. 4-5, the center (core) conductor 1 is a linear conductor for signal transmission. In this embodiment, the center conductor 1 is constituted solely of a linear portion 1a, so the extension direction of the center conductor 1 will be referred to as a first direction L herein. Further, the direction orthogonal to the first direction L will be referred to as a radial direction R; and in this radial direction R, the direction toward the center conductor 1 will be referred to as a radial inner side R1 and the direction away from the center conductor 1 will be referred to as a radial outer side R2, respectively.

The holder 2 is a cylindrical member comprised of a cylindrical insulator defining at the center thereof a thorough hole 23 through which the center conductor 1 extends and which supports the center conductor 1 inserted therein. The holder 2 is formed of an insulating material (non-conductive) material such as a resin in order to insulate the center conductor 1 from the outside. The length of the holder 2 in the first direction L is shorter than that of the center conductor 1. Therefore, the holder 2 supports the center conductor 1 by covering a center portion 14 of the center conductor 1 in the first direction L. Namely, opposed ends of the center conductor 1 are not covered by the holder 2, but exposed to present a first terminal portion 11 and a second terminal portion 12, respectively. The first terminal portion 11 is disposed on the side of the coaxial cable 120 and the second terminal portion 12 is disposed on the side of the camera module 110 (on the side of the receptacle A). Though FIG. 4 shows an exploded perspective view for the sake convenience, the center conductor 1 is insert-molded in the holder 2. At opposed end portions of the center portion 14 covered by the holder 2, there are formed a first annular protruding portion 14a and a second annular protruding portion 14b which protrude to the radial outer side R2. With the above-described integral arrangement of forming the annular protruding portions 14a, 14b at the opposed end portions of the center portion 14 of the center conductor 1 and insert-molding this center portion 14 in the holder 2, accidental detachment of the center conductor 1 from the holder 2 can be prevented reliably. Further, as compared with the outside diameter of the center portion 14, the respective outside diameters of the first terminal portion 11 and the second terminal portion 12 are set smaller. With this, the linear portion 1a of the center conductor 1 is constituted of the first terminal portion 11, the second terminal portion 12 and the center portion 14. Incidentally, in the center conductor 1, only either one of the first annular protruding portion 14a and the second annular protruding portion 14b may be formed. Further alternatively, the first terminal portion 11 or the second terminal portion 12 may be formed in a curved shape.

At its end portion on the side of the second terminal portion 12, the holder 2 flares out to the radial outer side R2 toward the second terminal portion 12 and includes a plurality of (three in this embodiment) elastically deformable protruding pieces 22. These protruding pieces 22 are constituted of cantilever beam-like arms each having a free end on the side of the second terminal portion 12. In operation, as the holder 2 is progressively inserted into the tubular shell 3, the protruding pieces 22 are elastically deformed to the radial inner side R1 and will reach a first engaging recess portion 31 of the tubular shell 3 to be described later, after which the protruding pieces 22 will return to the radial outer side R2, whereby engagement is established between the protruding pieces 22 and the first engaging recess portion 31 of the tubular shell 3. Thus, assembly between the holder 2 and the tubular shell 3 is easy and also as the engagement between the protruding pieces 22 and the first engaging recess portion 31 prevents inadvertent detachment of the holder 2 from the tubular shell 3.

The tubular shell 3 is a cylindrically shaped conductor member surrounding the radial outer side R2 of the holder 2 and includes a tubular end portion 34 protruding from the housing 8 (i.e. not covered by the housing 3). In the inner circumferential face of this tubular end portion 34, there is formed a tapered face 34b whose diameter progressively increases toward the opening. The tubular shell 3 is formed of metal. In the tubular shell 3, there is formed an annular extension portion 33 extending in an annular form from the inner circumferential face to the radial inner side R1. Further, in the tubular shell 3, at a part thereof on the side of the second terminal portion 12, there is formed the first engaging recess portion 31 receded in the annular form from the inner circumferential face to the radial outer side R2. And, as described above, to this first engaging recess portion 31, the plurality of protruding pieces 22 of the holder 2 will come into engagement. With this, the holder 2 is fixed to the tubular shell 3. As the bottom side of this first engaging recess portion 31 is closed, intrusion of electromagnetic noise to the holder 2 side is prevented. The first engaging recess portion 31 in this embodiment is formed by carrying out a cutting work in the inner circumferential face of the tubular shell 3. Further, in the tubular shell 3, there is also formed a second engaging recess portion 32 receded in an annular form from the outer circumferential face near the center to the radial inner side R1. As this second engaging recess portion 32 comes into engagement with a plurality of engaging pawls 81a to be described later of the housing 8, inadvertent detachment of the tubular shell 3 from the housing 8 is prevented. Still further, at the tubular end portion 34 of the tubular shell 3, there is formed a third engaging recess portion 34a receded in an annular form from the outer circumferential face to the radial inner side R1.

The inner seal member 4 provides sealing for preventing liquid or the like from entering the inside of the terminal module 30 acting as a coaxial cable. The inner seal member 4 is an annular-shaped member having elasticity (elastic member). The inner seal member 4 is mounted in the terminal module 30 such that one side face thereof in the first direction L is retained by the annular extension portion 33 and the other side face thereof is retained by the end face of the holder 2 in the first direction L.

In this way, with the terminal module 30 as described above, one side of the inner seal member 4 is placed in contact with the annular extension portion 33 and the holder 2 supporting the center conductor 1 is placed in contact with the other side of the inner seal member 4 and the protruding pieces 22 of the holder 2 are engaged with the first engaging recess portion 31 of the tubular shell 3. In other words, in the terminal module 30, the inner seal member 4 and the holder 2 are disposed at specified positions along the first direction L as being sandwiched between the annular extension portion 33 and the protruding pieces 22 of the holder 2. The terminal module 30 configured as above will be assembled with the housing 8 as being inserted toward a cylindrical space E3 of the housing 8.

As shown in FIGS. 3 through 5, the housing 8 is a case that accommodates the terminal module 30 and the outer seal member 6 and supports the terminal module 30 (tubular shell 3) by inserting this therein. As the outer face of the terminal module 30 is constituted of the conductive tubular shell 3, in order to insulate the tubular shell 3 from the outside of the connector module 10, the housing 8 is formed of an insulator (non-conductive) material such as a resin.

The housing 8 includes a cylindrically-shaped tubular portion 8A and an outer circumferential portion 8B protruding in an annular form from the tubular portion 8A to the radial outer side R2. In the inner circumferential face of the tubular portion 8A, there are provided the plurality of (four in this embodiment) engaging pawls 81a protruding from the base end portions thereof on the first terminal portion 11 side along the first direction L and protruding, on the leading ends thereof, to the radial inner side R1. As described above, these engaging pawls 81a are engaged with the second engaging recess portion 32 of the tubular shell 3. The surface of the outer circumferential portion 8B is exposed to be flush with the outer face of the connector case 10A. Then, by providing e.g. laser welding work in the outer circumferential portion 8B, the connector case 10A and the connector 10B (housing 8) will be fixed to each other in a water-tight manner.

The tubular portion 8A includes, with the outer circumferential portion 8B as a border therebetween, a first cylindrical portion 81 on the first terminal portion 11 side along the first direction L and a second cylindrical portion 82 on the second terminal portion 12 side along the first direction L. In the outer circumferential face of the second cylindrical portion 82, there are formed a plurality of (two in this embodiment) engaging protruding portions 83 protruding on the radial outer side R2 with which the rotation-preventing mechanism 5 comes into engagement. This engaging producing portion 83 includes a stepped portion 83a with which a second rotation-preventing member 5B to be described later comes into engagement and a protruding engaging portion 83b further protruding on the radial outer side R2 on the opposed sides (see FIG. 4). In the inner circumferential face of the second cylindrical portion 82, there is formed a seal recess portion 84 in which the outer seal member 6 will be fitted. This outer seal member 6 is disposed to come into contact with the seal recess portion 84 acting as the bottom of the housing 8 in the first direction L. The outer seal member 6 too is an annular member having elasticity (elastic member), like the inner seal member 4.

The above-described inner seal member 4 comes into pressed contact with the inner circumferential face of the tubular shell 3 and the outer circumferential face of the center conductor 1 and the outer seal member 6 comes into pressed contact with the inner circumferential face of the housing 8 and the outer circumferential face of the tubular shell 3, thereby to prevent intrusion of liquid to the cylindrical space E3 of the housing 8. Then, by providing e.g. laser welding work in the outer circumferential portion 8B, the connector case 10A and the connector 10B (housing 8) will be fixed to each other in a water-tight manner, thus preventing intrusion of liquid to the inside of the connector case 10A. In case the connector module 10 is used in the camera unit 100 as a vehicle-mounted camera as provided in this embodiment, the sealing using the inner seal member 4 and the outer seal member 6, etc. will be effective. Namely, the camera unit 100 as a vehicle-mounted camera will often be used for driving or steering assistance or recording traveling conditions. In such case, the camera unit 100 will often be mounted in a bumper or a door or on the exterior of the vehicle. The exterior of the vehicle will often be subjected to splashing of water or water droplets from rain, snow or a water pool on a road. Therefore, it is advantageous to provide the connector module 10 with the water-proof property by proving the sealing arrangement described above.

As shown in FIGS. 3-4, the shield case 7 consists of a first member 7A and a second member 7B. The shield case 7 shields the inner space E2 of the shield case 7 against electromagnetic waves present in the outer space E1 of the shield case 7, e.g. electromagnetic waves such as electromagnetic noises that can influence signals transmitted via the center conductor 1, electromagnetic noises that influence e.g. the electronic circuit 102 of the camera module 110 (see also FIG. 5). To this end, the shield case 7 too is formed of a conductive material such as a metal.

The first member 7A is formed like a flat plate having at the center thereof a circular opening portion 73 through which the terminal module 30 (tubular shell 3) extends. In an inner edge portion 73e of this opening portion 73, there are formed a plurality of (six in this embodiment) elastically deformable elastic portions 75 protruding to be bent in the first direction L. As inner ends 75a of these plurality of elastic portions 75 come into contact with a bottom portion 34a1 and one side wall 34a2 (an example of an outer circumferential portion of the tubular shell 3) of the third engaging recess portion 34a, electrical connection is formed (see also FIG. 5). In this embodiment, each one of the plurality of elastic portions 75 is formed in a trapezoidal shape and are of the identical shape and arranged equidistantly in the circumferential direction. Incidentally, the plurality of elastic portions 75 may be formed like triangular plates or the like and the shapes and the distances thereof may be varied, thus there are not limitations in these regards.

Further, the first member 7A includes a plurality of (two for each side, eight in total, in this embodiment) extension members 74 (an example of "elastic piece") extending to be bent toward the second member 7B from the outer edge portion 73a of the rectangular flat plate. In this embodiment, each one of the plurality of extension members 74 is formed like a bar having a curved leading end portion 74a, these members being of the identical shape. This extension member 74 is elastically deformable, with a curved convex face of the curved leading end portion 74a protruding to be able to contact the second member 7B. Namely, with these extension members 74, a gap G1 is formed between the first member 7A and the second member 7B (see FIG. 5). In this way, as the inner ends 75a of the plurality of elastic portions 75 come into contact with the outer circumferential portion of the tubular shell 3 and the leading end portions 74a of the extension members 74 come into contact with the second member 7B, the electrical connection is established between the shield case 7 and the terminal module 30 (tubular shell 3). Incidentally, the plurality of extension members 74 are not limited to the above, but may be formed as wide flat plates or the like.

The second member 7B is a bottomed rectangular tubular case and includes a rectangular bottom portion 71 orthogonal to the first direction L along the extension direction of the center conductor 1 and a side wall portion 72 bent from the circumference of the bottom portion 71 and extending along the first direction L. At the center of the bottom portion 71, there is formed a circular opening portion 71a through which the terminal module 30 (tubular shell 3) extends, and on the radial inner side R1 of the opening portion 71a of the bottom portion 71, the elastic portion 75 is located and the leading end portion 74a of the extension member 74 comes into contact with the portion of the bottom portion 71 on more radial outer side R2 than the opening portion 71a. In a pair of first corner portions 71b located on a diagonal line of the bottom portion 71, cutouts are formed. At and through this first corner portion 71b, there is formed a pin insertion hole 71c in which a stopper pin P will be inserted for preventing inadvertent withdrawal of the second member 7B from the connector case 10A. Further, in a pair of second corner portions 71d located on the diagonal line different from that of the pair of first corner portions 71b, there are formed therethrough protrusion insertion holes 71d1 in which stopper protrusions T formed in the connector case 10A to be described later are to be inserted. The side wall portions 72 extend vertically along the first direction L in correspondence with the shape of the bottom portion 71.

The rotation-preventing mechanism 5 includes a first rotation-preventing member 5A and a second rotation-preventing member 5B. These first rotation-preventing member 5A and second rotation-preventing member 5B are formed of insulator (non-conductive) material such as a resin. The rotation-preventing mechanism 5 is disposed between the connector case 10A and the shield case 7 and comes into engagement with the housing 8, thus preventing rotation of this housing 8 (see also FIG. 5). The first rotation-preventing member 5A is a ring-like member formed of a pair of curved portions 51 and a pair of straight portions 52. At the centers of the straight portions 52, there are formed a pair of block portions 52a protruding on the radial outer side R2 and at the centers of the faces of the pair of block portions 52a on the side of the connector case 10A, there are formed grooves 52b along the radial direction R. The second rotation-preventing member 5B is provided in the form of a ring formed integrally of a pair of U-shaped members 53 arranged in reverse from each other and joined to each other. In an inner side face of this U-shaped member 53, there is formed, as a cutout, an engaging recess portion 53a in which the protruding engaging portion 83b of the housing 8 described above is engaged; and in outer side faces of a pair of corner portions on a diagonal line of the second rotation-preventing member 5B, there are formed depression portions 55 depressed in L-shape.

The first rotation-preventing member 5A prevents rotation of the housing 8 relative to the connector case 10A as the groove 52b of the block portion 52a is engaged and fixed in position relative to the protruding portion 15b1 of the connector case 10A to be described later and the engaging protruding portion 83 of the housing 8 is placed in opposition to the straight portion 52. Further, the second rotation-preventing member 5B prevents rotation of the housing 8 relative to the connector case 10A as the depression portion 55 is engaged and fixed in position with a first bulging portion 15c of the connector case 10A to be described later and the protruding engaging portion 83b of the housing 8 is engaged with the engaging recess portion 53a as being in contact with the stepped portion 83a formed in the second cylindrical portion 82 of the housing 8. In this way, thanks to the first rotation-preventing member 5A and the second rotation-preventing member 5B, rotation of the housing 8 relative to the connector case 10A can be prevented in a reliable manner. However, either one of the first rotation-preventing member 5A and the second rotation-preventing member 5B may be omitted.

As shown in FIG. 3, the connector case 10A is a box-like member having the bottom portion 15 and the side walls 16 formed of an insulator (non-conductive) material such as a resin. In an outer face of the bottom portion 15, there is formed an annular recess portion 15a as an annular-shaped groove in which the outer circumferential portion 8B of the housing 8 is to be inserted. At the center of this annular recess portion 15a, there is formed an insertion hole portion 15a1 in which the second cylindrical portion 82 of the housing 8 is to be inserted. As described above, when the outer circumferential portion 8B is inserted to the annular recess portion 15a, the surface of the outer circumferential portion 8B will be in flush with the outer face of the connector case 10A and by providing e.g. a laser welding work in the outer circumferential portion 8B, the connector case 10A and the connector 10B (housing 8) are fixed to each other in a water-tight manner. At a pair of corner portions located on a diagonal line of the outer faces of the side walls 16, there are formed, as cutouts, bolt accommodating portions 16a in which heads of bolts B will be fitted and there are formed therethrough screw holes Ba into which the bolts B are to be threaded.

As shown in FIG. 4, in the inner face of the bottom portion 15, there is formed a circumferential groove portion 15b along the outer circumferential face of the first rotation-preventing member 5A; and at a position of this circumferential groove portion 15b corresponding to the groove 52b of the first rotation-preventing member 5A, there is formed, as a protrusion, a protruding portion 15b1 engageable with the groove 52b. At the corner portions located on the diagonal line of the inner faces of the side walls 16, there are formed a pair of first bulging portions 15c having engaging holes Pa in which the stopper pins P will be engaged. At the corner portions in the inner faces of the side walls 16 located on the different diagonal line from that of the pair of first bulging portions 15c, there are formed a pair of second bulging portions 15d having stopper protrusions T engageable with protrusion insertion holes 71d1 of the second member 7B.

An assembled finished article in which the terminal module 30 and the shield case 7 have been accommodated in and fixed to the housing 8 and the connector case 10A is a "connector module 10" in a narrow sense of the term. This connector module 10 in the narrow sense of the term with addition of the main body case 9 thereto may be referred to as the "connector module 10" also. In the case of such inclusion of the main body case 9, there is possibility of the camera module 110 being accommodated in the main body case 9. In this latter case, the connector module 10 will be understood to be substantially synonymous with the camera unit 100. Therefore, all of the assembled article of the terminal module 30 and the shield case 7 being accommodated and fixed the housing 8 and the connector case 10A, the intermediate assembled article including the main body case 9 additionally, and the camera unit 100 accommodating the camera module 110 can be caused to correspond to the connector module 10.

Figure 6:
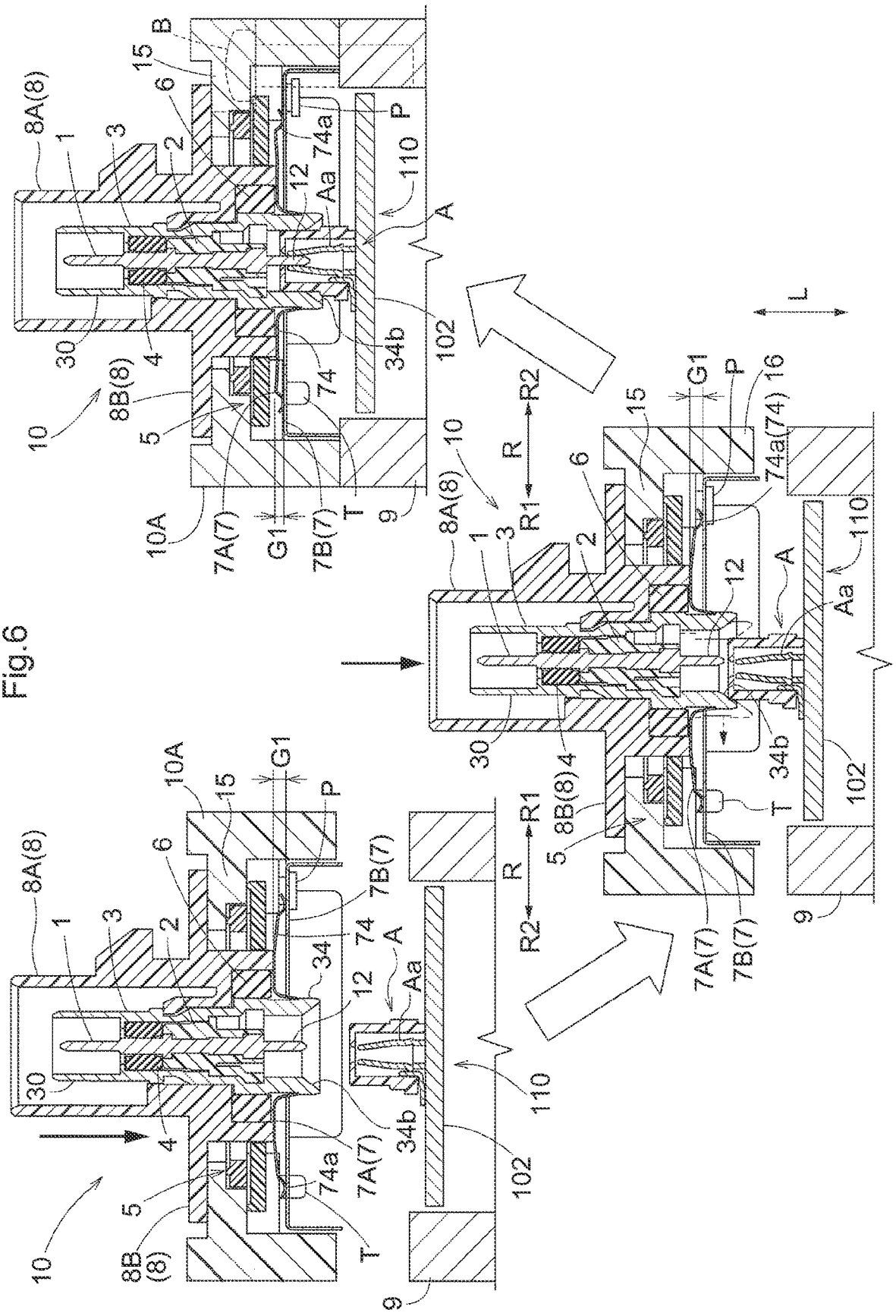
FIG. 6 is a vertical section showing a state of connecting a connection target instrument to the connector module relating to the first embodiment.

FIG. 6 illustrates a mode of electrically connecting the camera module 110 to the above-described narrowly defined connector module 10 relating to the first embodiment. As shown in FIG. 4, from the side of the second cylindrical portion 82 of the housing 8, the terminal module 30, the outer seal member 6, the connector case 10A, the first rotation-preventing member 5A, the second rotation-preventing member 5B, and the first member 7A and the second member 7B of the shield case 7 will be assembled in this mentioned order and then the shield case 7 will be fixed to the connector case 10A via the stopper pins P, whereby the connector module 10 is fabricated. As shown in FIG. 6, the tubular end portion 34 of the tubular shell 3 of this connector module 10 will be brought closer to the receptacle A having a conductor Aa electrically connected to the circuit board formed in the electronic circuit 102. In this, if the axis of the conductor As of the receptacle A is displaced or deviated in the radial direction R relative to the axis of the tubular shell 3, the receptacle A will come into contact with the tapered face 34b formed in the inner circumferential face of the tubular end portion 34 of the tubular shell 3.

And, as the connector module 10 and the receptacle A are bought further closer to each other, the tapered face 34b and the receptacle A will come into contact with each other; and along the tapered face 34b, the terminal module 30, the housing 8 and the rotation-preventing mechanism 5 will be moved relative to the connector case 10A in the radial direction R. Further, due to the actions of the stopper pin P and the stopper protrusion T, the first member 7A of the shield case 7 engaged with the tubular shell 3 will move in slidable contact in the radial direction R relative to the second member 7B of the shield case 7 fixed to the connector case 10A. In the course of this, since the curved convex face formed at the leading end portion 74a of the extension member 74 of the first member 7A is placed in contact with the second member 7B via the gap G1, the terminal module 30, the housing 8, etc. will be moved smoothly in the radial direction R relative to the connector case 10A, whereby the axis of the tubular shell 3 and the axis of the conductor Aa of the receptacle will be bought into agreement and both the center conductor 1 (second terminal portion 12) and the conductor Aa will be electrically connected. Under this condition, by providing e.g. a laser welding work in the outer circumferential portion 8B of the housing 8, the connector case 10A and the connector 10B (housing 8) will be fixed and sealed to each other. Finally, the connector case 10A and the main body case 9 will be fastened to each other via the plurality of bolts B. In this, the second member 7B placed in contact with the main body case 9 will be pushed up and the extension members 74 will be elastically deformed in such a manner as to fill the gap G1 between the first member 7A and the second member 7B, thus rendering the contact between the first member 7A and the second member 7B more reliable.

In this embodiment, since the shield case 7 is engaged with the tubular shell 3 via the elastic portions 75, even if there occurs e.g. vibration, the resultant shock can be effectively absorbed by flexible deformation of the elastic portions 75. As a result, the durability of the tubular shell 3 and the shield case 7 can be enhanced. Moreover, the shield case 7 of this embodiment includes the first member 7A and the second member 7B; and in the first member 7A, there are formed the extension members 74 (elastic pieces) as protrusions that can contact the second member 7B. Further, in the connector 10B before the connector case 10A is fixed to the main body case 9 via the bolts B, the gap G1 is formed between the first member 7A and the second member 7B by the extension members 74 formed in the first member 7A. Namely, with flexible deformation of the extension members 74, the first member 7A can move relative to the second member 7B. As a result, at the time of attaching the receptacle A to the connector 10B, even if there is present a positional displacement or deviation between the axes thereof, as the first member 7A engaged via the elastic portions 75 with the tubular shell 3 covering the center conductor 1 is moved together with the tubular shell 3, positional alignment is made possible with correction of the positional displacement.

Furthermore, when the connector case 10A is fixed to the main body case 9 via the bolts B, in the connector 10B, thanks to the elastic deformation of the extension members 74, the gap G1 between the first member 7A and the second member 7B will be reduced, thus establishing electrical connection between the first member 7A and the second member 7B. Consequently, the connector module 10 of this embodiment can maintain high sealing performance. Further, if the elastic pieces are constituted of the plurality of extension members 74 extending from the outer edge portion 73a of the rectangular-shaped flat plate as described above, these extension members 74 can be elastically deformed easily and the contact state between the first member 7A and the second member 7B can be rendered favorable. Moreover, the above arrangement requires only providing the extension members 74 as extensions from the outer edge portion 73a of the flat plate, working of the first member 7A is easy.

If the annular shaped outer circumferential portion 8B fixed to the outer face of the connector case 10A is formed in the housing 8 as provided in the instant embodiment, this outer circumferential portion 8B can be easily fixed to the connector case 10A by laser welding. In addition, even when a load is applied to the connector 10B due to e.g. vibration, this is received by the connector case 10A and the housing 8, so load application between the conductor members (the center conductor 1, the tubular shell 3, the shield case 7) of the connector 10B and the electronic circuit 102 of the camera module 110 can be suppressed. Further, with provision of the rotation-preventing mechanism 5 for preventing the rotation of the housing 8 as provided in the instant embodiment, positioning of the housing 8 can be carried out reliably and the operation of fixing the housing 8 with the connector case 10A can be carried out easily.

Second Embodiment

Next, with reference to FIGS. 7 through 9, a connector module 10 relating to a second embodiment will be explained in details. Incidentally, in the following discussion, those effects, functions and members having similar to those of the first embodiment will be explained with using the same or like reference signs and numerals for the sake of convenience. The connector module 10 relating to the second embodiment differs from the first embodiment in that this module 10 does not include the rotation-preventing mechanism 5, but includes an annular seal member S.

Figure 9:
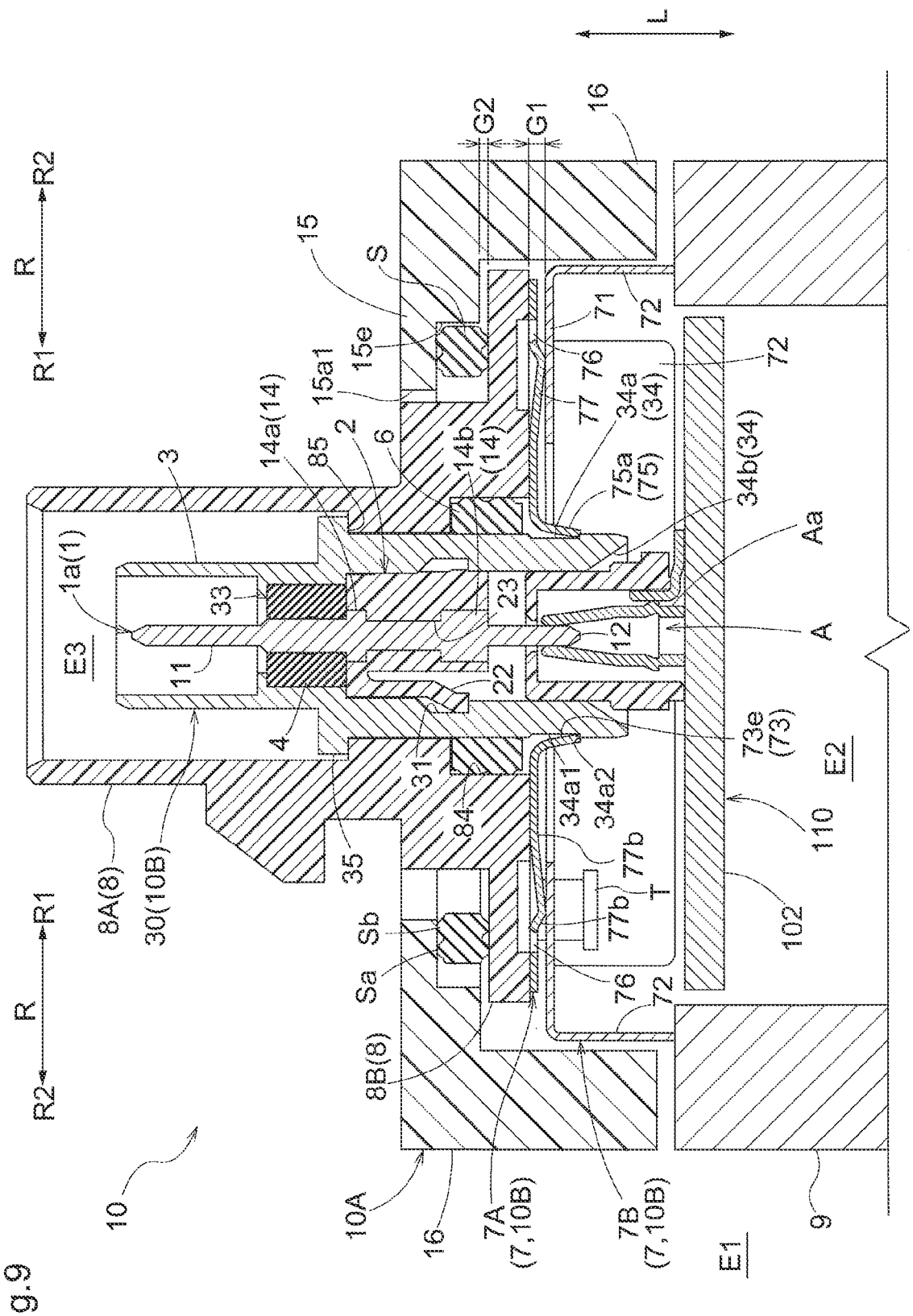
FIG. 9 is a vertical section of the connector module according to the second embodiment.

As shown in FIG. 9, the connector module 10 includes a connector case 10A and a connector 10B. The connector 10B includes a housing 8, a terminal module 30, an outer seal member 6, a shield case 7, and an annular seal member S (an example of "seal member"). Further, the terminal module 30 includes a center conductor 1, a holder 2, a tubular shell 3 and an inner seal member 4.

Figure 7:
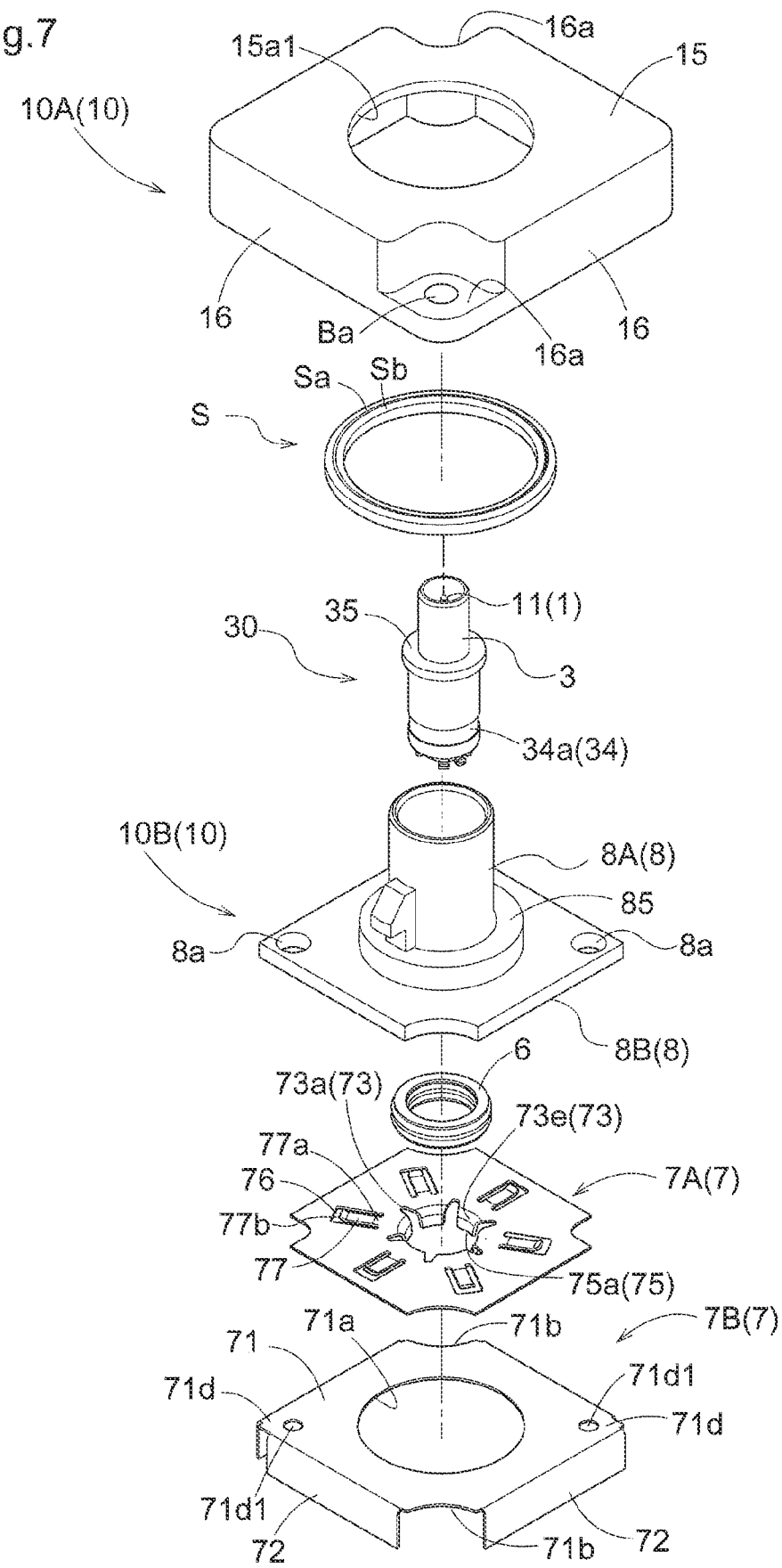
FIG. 7 is an exploded perspective view of a connector module according to a second embodiment.
Figure 8:
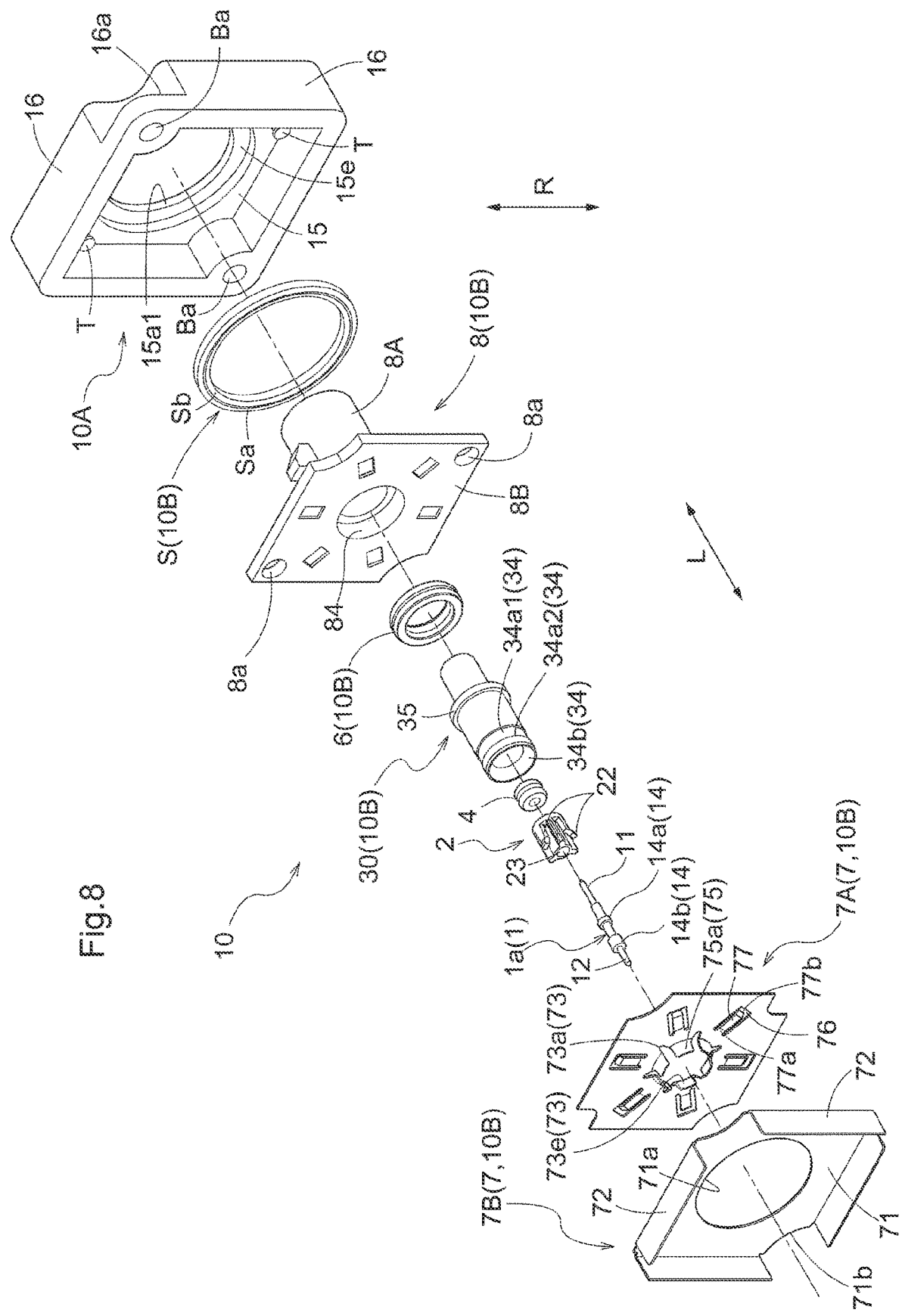
FIG. 8 is an exploded perspective view of the connector module according to the second embodiment.

As shown in FIGS. 7-8, the center conductor 1, the holder 2 and the inner seal member 4 relating to this embodiment are identical to those in the first embodiment, so explanation thereof will be omitted.

As shown in FIG. 9, the tubular shell 3 is a cylindrically shaped conductive member covering a radial outer side R2 of the holder 2 and includes a tubular end portion 34 protruding from the housing 8. In the inner circumferential face of this tubular end portion 34, there is formed a tapered face 34b whose diameter progressively increases toward the opening. The tubular shell 3 is formed of metal. In the tubular shell 3, at a part thereof on the side of the first terminal portion 11, there is formed an annular extension portion 33 extending in an annular form from the inner circumferential face to the radial inner side R1. Further, in the tubular shell 3, at a part thereof on the side of the second terminal portion 12, there is formed a first engaging recess portion 31 receded in the annular form from the inner circumferential face to the radial outer side R2. To this first engaging recess portion 31, a plurality of protruding pieces 22 of the holder 2 will come into engagement. With this, the holder 2 is fixed to the tubular shell 3. As the bottom side of this first engaging recess portion 31 is closed, intrusion of electromagnetic noise to the holder 2 side is prevented. The first engaging recess portion 31 in this embodiment is formed by carrying out a cutting work in the inner circumferential face of the tubular shell 3. Further, in the tubular shell 3, there is formed an annular protruding portion 35 protruding in an annular form from the outer circumferential face near the center to the radial outer side R2. As this annular protruding portion 35 and an annular stepped portion 85 of the housing 8 to be described later are fixed to each other via bonding, welding, etc., inadvertent detachment of the tubular shell 3 from the housing 8 is prevented. Still further, at the tubular end portion 34 of the tubular shell 3, there is formed a third engaging recess portion 34a receded in an annular form from the outer circumferential face to the radial inner side R1.

The housing 8 is a case that accommodates the terminal module 30 and the outer seal member 6 and supports the terminal module 30 (tubular shell 3) by inserting this therein. As the outer face of the terminal module 30 is constituted of the conductive tubular shell 3, in order to insulate the tubular shell 3 from the outer face of the connector module 10, the housing 8 is formed of an insulator (non-conductive) material such as a resin.

The housing 8 includes a tubular portion 8A and an outer circumferential portion 8B protruding in a rectangular form from the end portion of the tubular portion 8A to the radial outer side R2. In the inner circumferential face of the tubular portion 8A, there is formed at the center thereof an annular stepped portion 85 which comes into contact with the tubular shell 3. At the end portion where the outer circumferential portion 8B is formed, there is formed a seal recess portion 84 to which the outer seal member 6 is to be attached. This outer seal member 6 is disposed to come into contact with the seal recess portion 84 forming the bottom of the housing 8 in the first direction L. The outer seal member 6 too, like the inner seal member 4, is an annular-shaped member having elasticity (elastic member).

As shown in FIG. 9, the outer circumferential portion 8B is accommodated in the connector case 10A and an annular seal member S is provided between the outer circumferential portion 8B and the connector case 10A. Due to this annular seal member S, a gap G2 is formed between the outer circumferential portion 8B and the connector case 10A. And, when the connector case 10A and the main body case 9 are fixed to each other via bolts B (not shown, see FIGS. 1 and 5 relating to the first embodiment), the annular seal member S is compressed, thus fixing the connector case 10A and the connector 10B (housing 8) in a water-tight manner. Further, as shown in FIGS. 7-8, cutouts are formed in a pair of corner portions located on a diagonal line of the outer circumferential portion 8B and in a pair of corner portions located on a diagonal different from the above-described angular portions, there are formed protruding through holes 8a in which stopper protrusions T formed in the connector case 10A to be described later are to be fitted. The protruding through hole 8a has an inside diameter greater than the outside diameter of the stopper protrusion T, so that the housing 8 is movable relative to the connector case 10A. Incidentally, if it is desired to secure the connector case 10A to the housing 8 firmly, laser welding will be possible with forming the connector case 10A of a transparent material.

The shield case 7 consists of a first member 7A and a second member 7B. The shield case 7 shields an inner space E2 of the shield case 7 against electromagnetic waves present in an outer space E1 of the shield case 7, e.g. electromagnetic waves such as electromagnetic noises that can influence signals transmitted via the center conductor 1, electromagnetic noises that influence e.g. the electronic circuit 102 of the camera module 110 (see also FIG. 9). To this end, the shield case 7 too is formed of a conductive material such as a metal.

The first member 7A is provided in a form of a rectangular flat plate defining, at the center thereof, a circular opening portion 73 through which the terminal module 30 (tubular shell 3) extends. In an inner edge portion 73e of this opening portion 73, there are formed a plurality of (six in this embodiment) elastically deformable elastic portions 75 bent in the first direction L to protrude in a cylindrical form. As each one of inner ends 75a of these plurality of elastic portions 75 comes into contact with a bottom portion 34a1 and one side wall 34a2 (an example of the outer circumferential portion of the tubular shell 3) of the third engaging recess portion 34a, electrical connection is established (see also FIG. 9). In this embodiment, each one of the plurality of elastic portions 75 is formed of an identical shape constituted of a trapezoidal plate and these portions 75 are arranged equidistantly in the circumferential direction. Incidentally, the plurality of elastic portions 75 may be constituted of e.g. triangular flat plates and the respective shape and spacing may be made different. There are no limitations in these regards.

Further, the first member 7A includes a plurality of (six in this embodiment) cut pieces 77 (an example of "elastic piece") formed by cutting away parts of the flat plate and bent toward the second member 7B. The cut pieces 77 have their base end portions 77a joined via a plurality of through hole portions 76 formed by cutting away a flat plate in U-shape and arranged radially. In this embodiment, the plurality of cut pieces 77 are of an identical shape with curved leading end portions 77b. This cut piece 77 is configured to be elastically deformable, so that a curved convex face of the curved leading end portion 77b is formed to protrude to be able to come into contact with the second member 7B. Namely, with these cut pieces 77, there is formed a gap G1 between the first member 7A and the second member 7B (see also FIG. 9). In this way, as the inner ends 77a of the plurality of elastic portions 75 come into contact with the outer circumferential portion of the tubular shell 3 and the leading end portions 77b of the cut pieces 77 come into contact with the second member 7B, the shield case 7 and the terminal module 30 (tubular shell 3) are electrically connected to each other.

The second member 7B has a same arrangement except for omission of the pin insertion hole 71c relating to the first embodiment. Therefore, explanation thereof will be omitted.

As shown in FIGS. 7-9, the annular seal member S is a circular annular member (elastic member) having elasticity and providing shielding against intrusion of liquid or the like to the inside of the connector case 10A. In an outer circumferential portion on the radial outer side R2 of the annular seal member S, there is formed a first annular protruding portion Sa that comes into pressed contact with the outer circumferential side of the outer circumferential portion 8B of the housing 8 and the outer circumferential side of a seal accommodating recess portion 15e of the connector case 10A to be described later. Further, in an inner circumferential portion on the radial inner side R1 of the annular seal member S, there is formed a second annular protruding portion Sb that comes into pressed contact with the inner circumferential side of the outer circumferential portion 8B of the housing 8 and the inner circumferential side of the seal accommodating recess portion 15e of the connector case 10A. These portions, i.e. the first annular protruding portion Sa and the second annular protruding portion Sb, are arranged in a common plane in the radial direction R. By providing separately the first annular protruding portion Sa and the second annular protruding portion Sb, even when one of the annular protruding portions Sa, Sb is deformed to invite deterioration in the water-proof performance, the water-proof function can be maintained by the other one of the annular protruding portions Sa, Sb.

The connector case 10A is a box-like member having the bottom portion 15 and the side walls 16 formed of an insulator (non-conductive) material such as a resin. At the center of the bottom portion 15, there is formed an insertion hole portion 15a1 in which the tubular portion 8A of the housing 8 is to be inserted. At a pair of corner portions located on a diagonal line of the outer faces of the side walls 16, there are formed, as cutouts, bolt accommodating portions 16a in which heads of bolts B will be fitted and there are formed therethrough screw holes Ba into which the bolts B will be threaded.

As shown in FIG. 8, in the inner face of the bottom portion 15, there is formed the seal accommodating recess portion 15e as a circumferential groove for accommodating the annular seal member S. In the inner face of the side wall 16 and at a pair of corner portions located on a diagonal line different from the bolt accommodating portion 16a, there are formed stopper protrusions T engageable with the protruding insertion holes 71d1 of the second member 7B.

As shown in FIG. 9, in this embodiment too, if the axis of the receptacle A is displaced or deviated in the radial direction R from the axis of the tubular shell 3, the terminal module 30 and the housing 8 will move relative to the connector case 10A in the radial direction R. Further, the first member 7A of the shield case 7 engaged with the tubular shell 3 will move in slidable contact in the radial direction R relative to the second member 7B of the shield case 7 fixed to the connector case 10A with the stopper protrusions T. In this, the curved convex face formed at a leading end portion 77b of a cut piece 77 of the first member 7A will come into contact with the second member 7B via a gap G1 and as the gap G2 is formed by the annular seal member S between the outer circumferential portion 8B of the housing 8 and the connector case 10A, the terminal module 30 and the housing 8 will smoothly move relative to the shield case 7 in the radial direction R and the axis of the tubular shell 3 and the axis of the conductor Aa of the receptacle A will be brought into agreement with each other and electrical connection will be established for both the center conductor 1 (second terminal portion 12) and the conductor Aa. Lastly, the connector case 10A and the main body case 9 will be fastened to each other via the plurality of bolts B. As a result, the extension members 74 will be elastically deformed in such a manner as to fill the gap G1 between the first member 7A and the second member 7B and the annular seal member S will be compressed in such a manner as to fill the gap G2 between the outer circumferential portion 8B of the housing 8 and the connector case 10A, whereby the contact between the first member 7A and the second member 7B is rendered reliable and the desired water-proof performance is maintained also.

If the elastic pieces are constituted of a plurality of cut pieces 77 formed radially in the flat plate of the first member 7A as so provided in this embodiment, the cut pieces 77 can be elastically deformed easily and the contact state between the first member 7A and the second member 7B is rendered favorable. Moreover, by providing the through hole portion 76 within a minimum area, it becomes also possible to secure a larger flat plate area for the first member 7A and a larger area for the contact between the first member 7A and the second member 7B. Further, as the cut piece 77 is formed within the flat plate of the first member 7A, it becomes possible to improve the yield of material to form the first member. 7A. The other functions and effects are same as those of the first embodiment, thus explanation thereof being omitted.

OTHER EMBODIMENTS (1) The shield case 7 in the first embodiment and the shield case 7 in the second embodiment differ in the shape of the first member 7A. However, either first member 7A may be employed in both the embodiments.

(2) In the foregoing embodiment, the inner ends 75a of the elastic portions 75 are brought into contact with the bottom portion 34a1 and the one side wall 34a2 of the third engaging recess portion 34a. In addition, the center portions of the elastic portions 75 too may be brought into contact with the bottom portion 34a1 of the third engaging recess portion 34a, and the contact portion between the elastic portions 75 and the third engaging recess portion 34a is not particularly limited. Moreover, the elastic portion 75 may be bent from the inner edge portion 73e to protrude in the opposite direction to the side wall portion 72 (direction opposite to the inner space E2 of the shield case 7).

(3) With omission of the rotation-preventing mechanism 5 used in the first embodiment, a positioning protrusion or the like maybe provided in the outer circumferential portion 8B of the housing 8.

(4) In the housing 8 described above, the tubular portion 8A was formed cylindrical. Instead, it may be formed like an angular tube having a polygonal cross section. Further, in the housing 8 relating to the first embodiment, the outer circumferential portion 8B was formed like a circular ring. However, it may be formed polygonal. Also, in the housing 8 relating to the second embodiment, the outer circumferential portion 8B was formed rectangular, but this may be formed like a circular ring or like a polygonal shape other than the rectangular shape.

(5) The connector module 10 described above is not limited to a coaxial connector, but maybe a multiple-pole differential connector.

The invention claimed is:

1. A connector module configured to be electrically connected to a connection target instrument, the connector module comprising:
   a connector case to be fixed to a main body case of the connection target instrument via a fastener member;
   a connector inserted in the connector case;
   the connector including a conductive contact, an insulator holder supporting the contact inserted therein, a conductive tubular shell surrounding the outer side of the holder, an insulator housing supporting the tubular shell inserted therein, and a conductive shield case engageable with the tubular shell for shielding against external electromagnetic waves;
   the shield case including a first member having an elastic portion to come into contact with an outer circumferential portion of the tubular shell protruding from the housing and a second member in the form of a bottomed tube coming into contact with the first member;
   the first member forming an elastic piece contactable with the second member; and
   fixing of the connector case to the main body case via the fastener member causing, in the connector, elastic deformation of the elastic piece, resulting in decrease in a gap between the first member and the second member, consequently in establishment of electrical connection between the first member and the second member, wherein:
   the housing includes an outer circumferential portion that protrudes to the outer side and that is fixed to the inner face of the connector case; and
   there is provided a seal member capable of forming a gap between the connector case and the outer circumferential portion.

2. The connector module of claim 1, wherein the elastic piece is formed by cutting out a part of the first member.

* * * * *